(12) United States Patent
Yamamoto et al.

(10) Patent No.: US 7,105,859 B2
(45) Date of Patent: Sep. 12, 2006

(54) NITRIDE SEMICONDUCTOR LIGHT-EMITTING DIODE CHIP AND METHOD OF MANUFACTURING THE SAME

(75) Inventors: Kensaku Yamamoto, Mihara (JP); Toshio Hata, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/982,020

(22) Filed: Nov. 5, 2004

(65) Prior Publication Data
US 2005/0093016 A1    May 5, 2005

(30) Foreign Application Priority Data
Nov. 5, 2003  (JP)  ............... 2003-375589

(51) Int. Cl.
*H01L 33/00*  (2006.01)
*H01L 29/22*  (2006.01)

(52) U.S. Cl. ............... 257/95; 257/98; 257/103; 438/22

(58) Field of Classification Search ............ 257/95
See application file for complete search history.

(56) References Cited

U.S. PATENT DOCUMENTS 6,518,602 B1 *  2/2003  Yuasa et al. ............... 257/102
6,784,460 B1 *  8/2004  Ng et al. ..................... 257/95
6,784,463 B1 *  8/2004  Camras et al. ............... 257/99
2002/0123164 A1 *  9/2002  Slater et al. ............... 438/39
2003/0003690 A1 *  1/2003  Nering et al. ............... 438/463

FOREIGN PATENT DOCUMENTS

| JP | 10-321908 | 12/1998 |
|---|---|---|
| JP | 11-163403 | 6/1999 |
| JP | 11-177137 | 7/1999 |
| JP | 2000-068556 | 3/2000 |
| JP | 2002-270962 | 9/2002 |
| JP | 2003-046177 | 2/2003 |
| JP | 2003-218065 | 7/2003 |

* cited by examiner

*Primary Examiner*—Tu-Tu Ho
(74) *Attorney, Agent, or Firm*—Morrison & Foerster LLP

(57) ABSTRACT

A nitride semiconductor light emitting diode chip includes a transparent substrate and a nitride semiconductor stacked-layer structure formed on the upper surface of the substrate, the nitride semiconductor stacked-layer structure including a light-emitting layer and a plurality of other semiconductor layers, the substrate having an arbitrary crystallographic main surface and having a thickness of more than 120 µm, thereby providing an improved efficiency of extracting light from the chip. At least one of the division planes of the chip may be angled relative to a plane perpendicular to the main surface of the substrate and the lower surface of the substrate may have a smaller area than an upper region of the nitride semiconductor stacked-layer structure to further improve the efficiency of extracting light from the chip.

2 Claims, 4 Drawing Sheets

NITRIDE SEMICONDUCTOR LIGHT-EMITTING DIODE CHIP AND METHOD OF MANUFACTURING THE SAME

This nonprovisional application is based on Japanese Patent Application No. 2003-375589 filed with the Japan Patent Office on Nov. 5, 2003, the entire contents of which are hereby incorporated by reference.

BACKGROUND OF THE INVENTION

1. Field of the Invention

The present invention relates to a group III–V compound semiconductor light-emitting device, and more particularly to improvement in light extraction efficiency in a light-emitting diode chip including a plurality of nitride-based semiconductor layers stacked on a transparent substrate.

2. Description of the Background Art

In general, nitride semiconductor light-emitting diode chips are manufactured by forming an epitaxial wafer having a plurality of nitride semiconductor layers including an emission layer which are stacked on a substrate and then dividing the wafer into a plurality of chips. For a conventional gallium nitride (GaN)-based semiconductor light-emitting diode chip, a substrate of sapphire or the like is generally used and a light-emitting diode device including such a chip is now commercially available.

In a light-emitting diode device with a sapphire substrate, since the substrate is insulative, it is difficult to form a structure in which a p-side electrode and an n-side electrode are provided on the upper and lower sides of the substrate, respectively, and thus it is necessary to extract light from the light-emitting diode chip through a transparent electrode. Furthermore, since the sapphire substrate has a high hardness, it is necessary to process the substrate into a thin film state and then divide the wafer into chips.

Commercially available typical nitride semiconductor light-emitting devices according to the prior art are provided by forming a GaN-based semiconductor stacked-layer structure on a sapphire substrate and reducing thickness of the substrate to approximately 100 µm and then dividing the structure into chips. As disclosed in Japanese Patent Laying-Open No. 2002-270962, for example, in the case of dividing a GaN-based semiconductor light-emitting device layer formed on a sapphire substrate, the substrate is processed to a 80 µm thickness. Japanese Patent Laying-Open No. 2000-068556 investigates a method of producing chips with a good yield rate from an epitaxial wafer including a plurality of nitride semiconductor layers stacked on a sapphire substrate, whereby the wafer having a thickness of 80 µm is divided into chips.

As understood from the above, in the conventional nitride semiconductor light-emitting diode chip, it is necessary to form a transparent electrode (typically under a p-side electrode) as well as p-side and n-side electrodes on a surface of the semiconductor stacked-layer structure included in the chip. The backside of its substrate is joined to a pedestal. Then, due to the p-side and n-side electrodes which block light, there occurs a loss in efficiency of extracting light from the chip towards the outside.

The high hardness of the sapphire substrate also causes difficulties in dicing or scribing to divide the epitaxial wafer including the sapphire substrate into a plurality of light-emitting diode chips with a good yield rate. Accordingly, after formation of the epitaxial wafer, the thickness of the substrate needs to be reduced to less than 100 µm by grinding the substrate, for example. However, the reduced thickness of the substrate decreases the efficiency of extracting light from the side surface of the substrate towards the outside. Because of these circumstances, the conventional nitride semiconductor light-emitting diode chip including the sapphire substrate suffers a great loss in extracting light from the chip towards the outside.

SUMMARY OF THE INVENTION

In view of the above circumstances of the conventional art, a main object of the present invention is to provide a nitride semiconductor light-emitting diode chip having an improved light extraction efficiency with a good yield rate.

In one aspect of the present invention, a nitride semiconductor light-emitting diode chip includes a transparent substrate and a nitride semiconductor stacked-layer structure on the upper surface of the substrate, the nitride semiconductor stacked-layer structure including a light-emitting layer and a plurality of other semiconductor layers, the substrate having its main surface of an arbitrary crystallographic plane and having a thickness of more than 120 µm, whereby providing an improved efficiency of extracting light from the chip.

In another aspect of the present invention, a nitride semiconductor light-emitting diode chip includes a transparent substrate and a nitride semiconductor stacked-layer structure on the upper surface of the substrate, the nitride semiconductor stacked-layer structure including a light-emitting layer and a plurality of other semiconductor layers, the substrate having its main surface of an arbitrary crystallographic plane, at least one of side division planes of the chip being angled relative to a plane perpendicular to the upper surface of the substrate, and the lower surface of the substrate having a smaller area than an upper region of the nitride semiconductor stacked-layer structure, whereby providing an improved efficiency of extracting light from the chip.

The substrate may be an insulating substrate. The insulating substrate may be a sapphire substrate, a silicon carbide substrate or a spinel substrate.

A method of fabricating a nitride semiconductor light-emitting diode chip as described above may include the steps of: forming an epitaxial wafer having a plurality of nitride semiconductor layers including a light-emitting layer by crystal growth on an upper surface of a substrate, and dividing the wafer into chips using a laser light, whereby the yield rate of the chip can be improved. Incidentally a solid laser device can preferably be utilized as a source of laser light.

According to the one aspect of the present invention, the nitride semiconductor light-emitting diode chip includes the transparent substrate having its thickness more than 120 µm which is larger than that in the conventional chip. Then, the substrate of such a increased thickness can increase light emission from its side surface, thereby improving the efficiency of extracting light from the light-emitting diode chip. According to the another aspect of the present invention, at least one of the side division planes of the nitride semiconductor light-emitting diode chip is angled relative to a plane perpendicular to the upper surface of the substrate, and the lower surface of the substrate has a smaller area than the upper region of the nitride semiconductor stacked-layer structure. As such, due to reflection and refraction at the angled surface of the substrate, light emission from the side of the substrate increases, improving the efficiency of extracting light from the light-emitting diode chip.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
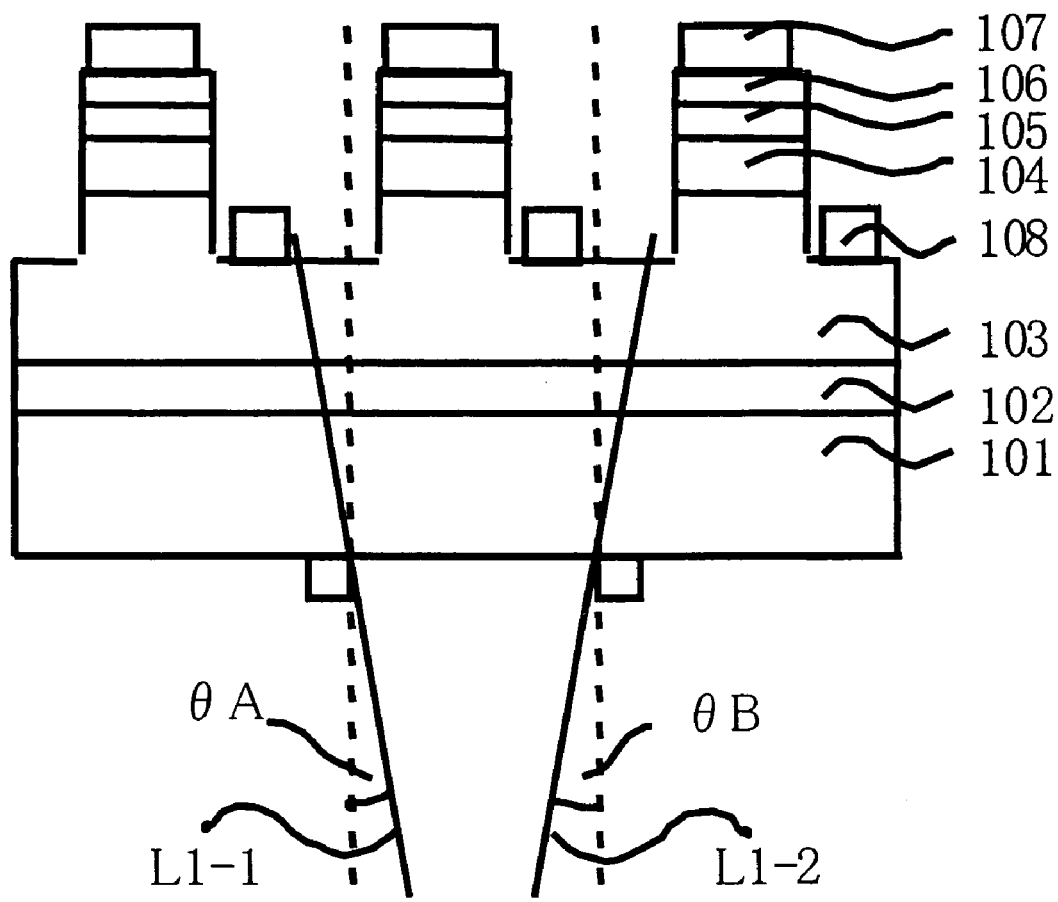
FIGS. 1A and 1B are schematic cross sectional views illustrating a method of dividing an epitaxial wafer into a plurality of GaN-based compound semiconductor light-emitting diode chips according to a first embodiment of the present invention.
Figure 1B:
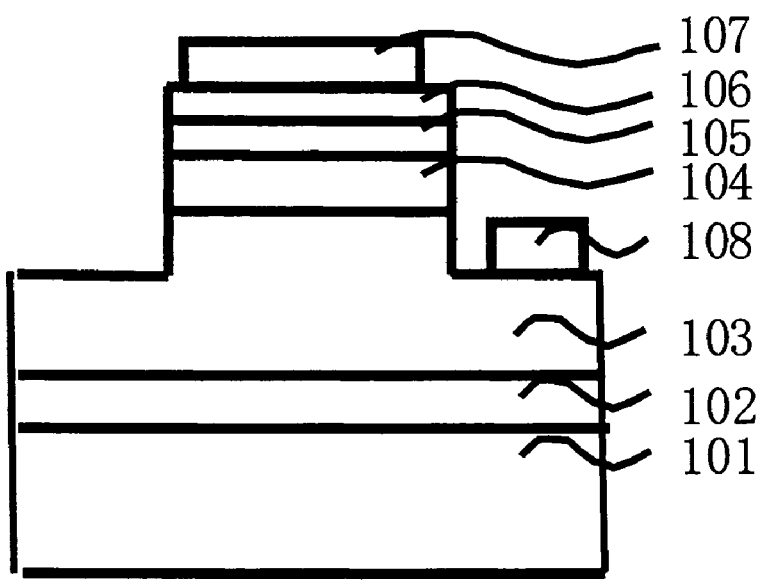

In FIGS. 1A and 1B, a chip division method is illustrated in schematic cross section in connection with a GaN-based compound semiconductor light-emitting diode according to a first embodiment of the present invention. FIG. 1A shows an epitaxial wafer including a plurality of light-emitting diode structures, while FIG. 1B shows one of the light-emitting diode chips into which the wafer is divided. Incidentally, in the drawings of the present application, the dimensional relation between thickness, width, and the like of various layers is arbitrarily changed for reasons of clarity and simplicity of the drawings, and thus the depicted dimensional relation does not shows the actual relation.

In the wafer of FIG. 1A, successively stacked on a 430 μm thick sapphire substrate 101 having a C-plane (0001) orientation are a GaN buffer layer 102, an n-type GaN contact layer 103, a multiple quantum well (MQW) active layer 104 formed of four pairs of $In_{0.08}Ga_{0.92}N$ quantum well layers and GaN barrier layers, a p-type AlGaN layer 105 and a p-type GaN contact layer 106. Then, a transparent Pd electrode 107 as a p-side contact electrode is formed on p-type GaN contact layer 106, and an n-side electrode 108 of Ti/Al is formed as an n-side contact electrode on n-type GaN contact layer 103.

In fabrication of the FIG. 1A wafer, a plurality of GaN-based semiconductor layers were epitaxially grown on sapphire substrate 101 by utilizing metal-organic vapor deposition (MOCVD). Sapphire substrate 101 was first mounted on a susceptor in a reaction chamber and the substrate was then baked in an atmosphere of a mixture of $NH_3$, $N_2$ and $H_2$ at 1200° C.

Subsequently, the substrate temperature was quickly reduced to 450° C., and GaN buffer layer 102 of 30 nm thickness was deposited on the substrate using trimethylgallium (TMG) and ammonia ($NH_3$) together with a carrier gas of $H_2$. The substrate temperature was then quickly increased to 1100° C., and n-type GaN contact layer 103 of 5 μm thickness was grown on buffer layer 102 using trimethylgallium (TMG) and $NH_3$ as well as monosilane ($SiH_4$) as a dopant.

Subsequently, MQW active layer 104 of four pairs of $In_{0.08}Ga_{0.92}N$ well layers each having a thickness of 3 nm and GaN barrier layers each having a thickness of 90 nm were formed on n-type contact layer 103 using trimethylindium (TMI), TMG and $NH_3$ at a substrate temperature of 750° C.

Further, Mg-doped p-type $Al_{0.08}Ga_{0.92}N$ clad layer 105 was grown on MQW active layer 104 to a thickness of 30 nm, using trimethylaluminum (TMA), TMG, and NH3 as well as cyclopentadienyl magnesium ($Cp_2Mg$) as a dopant at a substrate temperature of 1100° C. Subsequently, Mg-doped p-type GaN contact layer 106 of 120 nm thickness was deposited at the same substrate temperature on p-type clad layer 105 using TMG, $NH_3$ and $Cp_2Mg$, and then after the substrate temperature was reduced to a room temperature, the epitaxial wafer was taken out to the ambient air.

Subsequently, to activate the p-type dopant in the epitaxial wafer, a heat treatment furnace was used to carry out heat treatment in $N_2$ atmosphere at 800° C. for 15 minutes. Next, resist was applied on the upper surface of the wafer and photolithography was conducted, and then transparent Pd electrode 107 was formed on p-type GaN layer 106 to provide a p-side contact electrode.

Subsequently, organic cleaning was carried out to remove the resist. Resist was then applied again on the upper surface of the wafer and photolithography was conducted. The wafer was then selectively etched from p-type GaN layer 106 to n-type GaN layer 103 by using reactive ion etching (RIE),. Organic cleaning was carried out again to remove the resist. Resist was once again applied on the upper surface of the substrate and photolithography was conducted so as to form n-side electrode 108 of Ti/Al on n-type GaN layer 103.

Subsequently, organic cleaning was carried to remove the resist and yet once again resist was applied onto the upper surface of the wafer and photolithography was conducted, and then the upper surface of the wafer except for the regions of the electrodes is covered by an $SiO_2$ film (not shown).

The wafer was then bonded to a sheet and fixed to a jig, where the wafer was divided into a plurality of light-emitting diode chips using a solid laser device. More particularly, a YAG laser device was utilized and a harmonic laser light of 266 or 355 nm was used. In connection with the energy of the laser light, it is possible to use a pulsing or continuous laser light in a range of approximately 10 $\mu J/cm^2$–100 $mJ/cm^2$. The laser device is not limited to a YAG laser device, and it is possible to use any laser device which can emit laser light in a wavelength range from approximately 266 nm to 355 nm as long as scribing of the wafer can be carried out by utilizing local sublimation or thermal expansion of the sapphire substrate.

In manufacturing diode chips according to the conventional method, the sapphire substrate is ground and polished and then divided from its backside using a diamond cutter. With this method, however, it is difficult to carry out the chip division with a good yield rate while controlling the angle of division relative to the sapphire surface. According to the method of the present embodiment, it is possible to form the diode chip with a good yield rate and with a good controllability of the division angle.

Output characteristics of the GaN-based light-emitting diode chip according to the first embodiment as shown in FIG. 1B were compared with those of the conventional GaN-based light-emitting diode chip. In formation of the conventional light-emitting diode chip, an epitaxial wafer was formed similarly as in FIG. 1A. At the time of dividing the wafer into a plurality of light-emitting diode chips according to the conventional method, however, thickness of the wafer was reduced to approximately 100 µm by grinding and polishing the backside of the substrate and thereafter the chip division was carried out by mechanical scribing and breaking. The obtained conventional light-emitting diode chip generated an optical power output (Po) of 3.0 mW when the forward injection current (If) was 20 mA. On the other hand, the light-emitting diode chip of FIG. 1B according to the first embodiment generated Po=5.0 mW for If=20 mA.

That is, it is recognized that the light-emitting diode chip obtained by the chip division according to the first embodiment has the significantly improved optical power output as compared to the conventional chip. As a reason for this, it is considered that the chip division according to the conventional mechanical scribing method is difficult unless sapphire substrate 101 was ground and polished to a thickness as small as approximately 100 µm, while the method of the first embodiment which utilizes laser scribing enables the chip division even for the substrate having a large thickness as 430 µm, and then light emitted from the emission layer and reflected by the backside of the substrate can be easily extracted through the side surface of the thick substrate towards the outside, thereby improving the light extraction efficiency.

As a result of further investigation, it was found that Po=3.8 mW for If=20 mA in the case of the thickness of sapphire substrate 101 being 250 µm in the present embodiment. It was also found that the light-emitting diode chip of the present embodiment can have an improved optical power output as compared to the conventional art when the thickness of sapphire substrate 101 is more than 120 µm.

Second Embodiment

Figure 2:
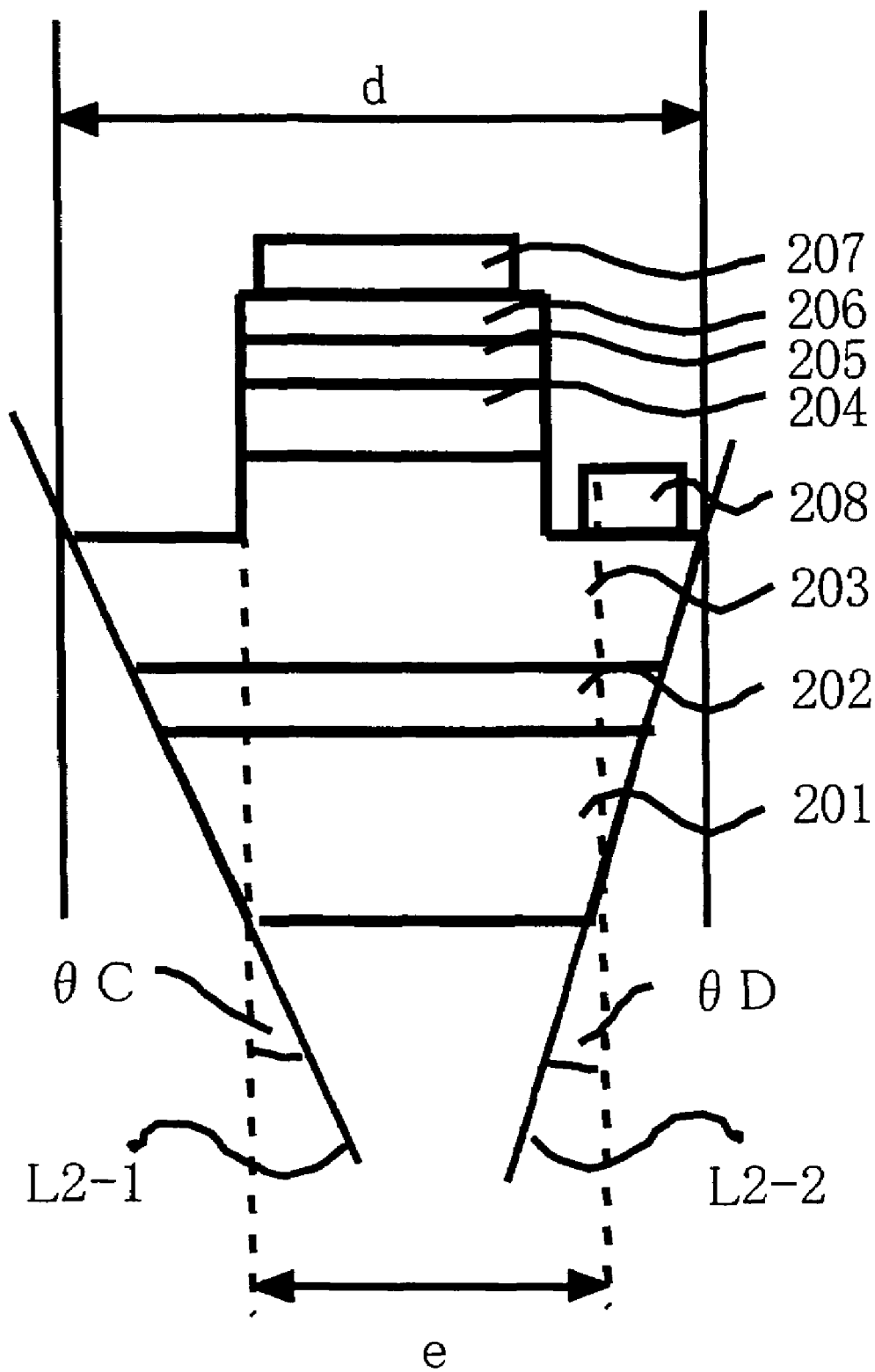
FIG. 2 is a schematic cross section illustrating a method of dividing an epitaxial wafer into a plurality of GaN-based compound semiconductor light-emitting diode chips according to a second embodiment of the present invention.

In FIG. 2, a chip division method is illustrated in a schematic cross section in connection with a GaN-based compound semiconductor light-emitting diode according to a second embodiment of the present invention. A method of fabricating a plurality of layers 201–208 in FIG. 2 is similar to that for layers 101–108 of the first embodiment, and thus will not be described repeatedly. The second embodiment used a sapphire substrate 201 having a thickness of 430 µm, as in the first embodiment. The second embodiment also utilized laser scribing as in the first embodiment to divide an epitaxial wafer into light-emitting diode chips.

In the second embodiment, the incidence angle of laser light entering the substrate was controlled using a jig to control angles θC and θD of laser scribe lines L2-1 and L2-2 relative to broken lines that are perpendicular to a main surface of the substrate in FIG. 2. In FIG. 2, an upper region of the semiconductor layers for radiating light was set to have a side length d of 350 µm, and the backside of the substrate was set to have a side length e of 200 µm by adjusting θC and θD. As shown in FIG. 2, scribe lines L2-1 and L2-2 were set to have clockwise angles of θC <0° and θD>0°, respectively, relative to the broken lines that are perpendicular to the main surface of the substrate.

The resulting light-emitting diode chip of the second embodiment generated an optical power output of Po=5.2 mW for an input current of If=20 mA. That is, it is recognized that the light-emitting diode chip of the second embodiment can have the improved efficiency of extracting light to the outside even as compared to the first embodiment. As a reason for this, it is considered that the light-emitting diode chip has its side surfaces angled relative to the plane perpendicular to the main surface of the substrate and then, due to influence of reflection and refraction at the angled side surfaces, light emitted from the emission layer can be readily radiated through the side surfaces of the substrate.

As a result of further investigation, when a light-emitting diode chip was formed to have e=100 µm with the fixed d=350 µm, it was able to obtain an optical power output of Po=5.4 mW for the input current of If=20 mA. As a result of still further investigation, however, when a light-emitting diode chip was formed to have a bottom surface of its substrate with a length e of less than 100 µm, its optical power output was Po=4.0 mW for the input current of If=20 mA. This is presumably because light emitted from the emission layer and reflected by the backside of the substrate was not easily extracted through the side surfaces of the substrate towards the outside, resulting in decrease of the light extraction efficiency.

Third Embodiment

Figure 3:
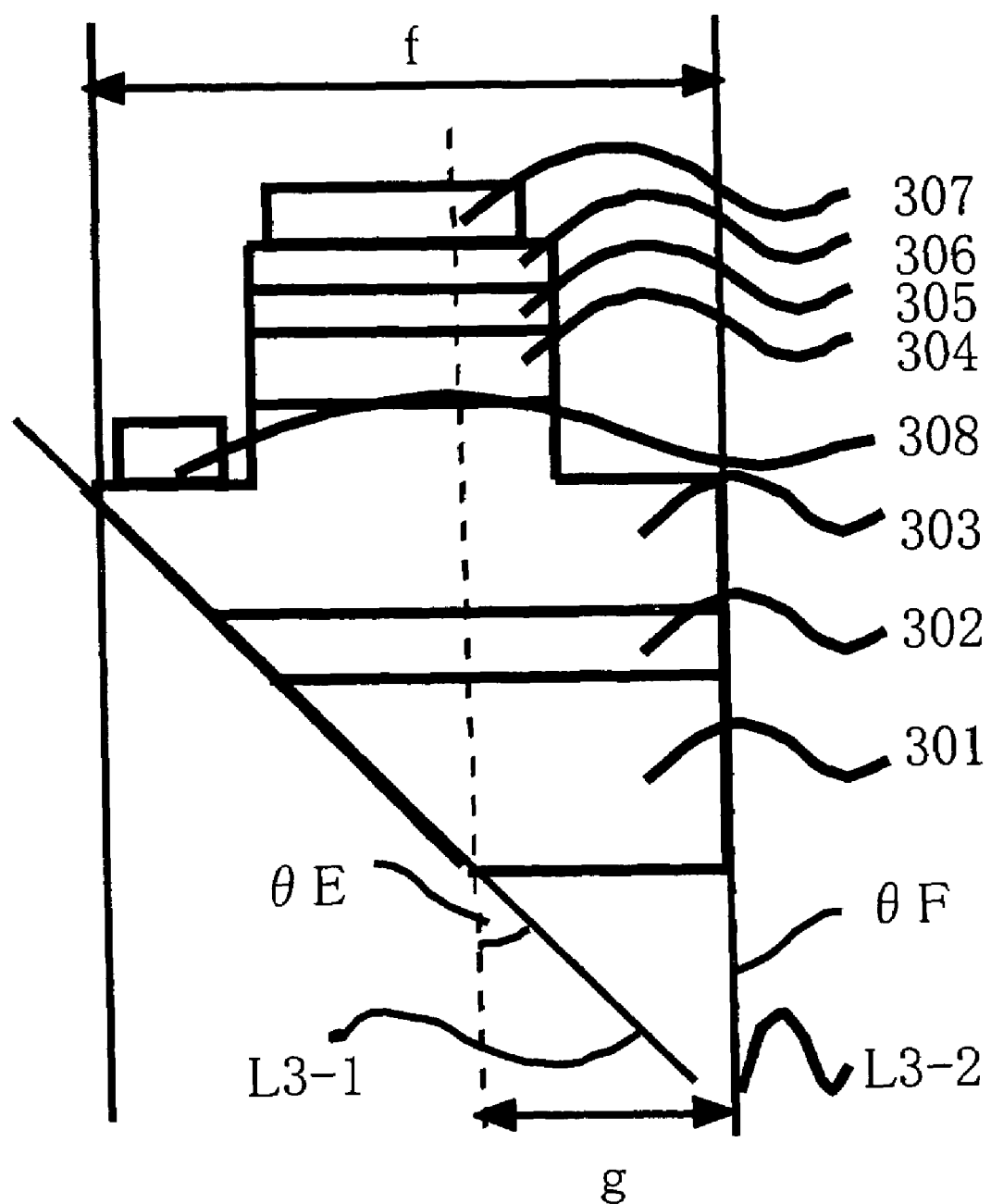
FIG. 3 is a schematic cross section illustrating a manner of dividing an epitaxial wafer into a plurality of GaN-based compound semiconductor light-emitting diode chips according to a third embodiment of the present invention.
Figure 4:
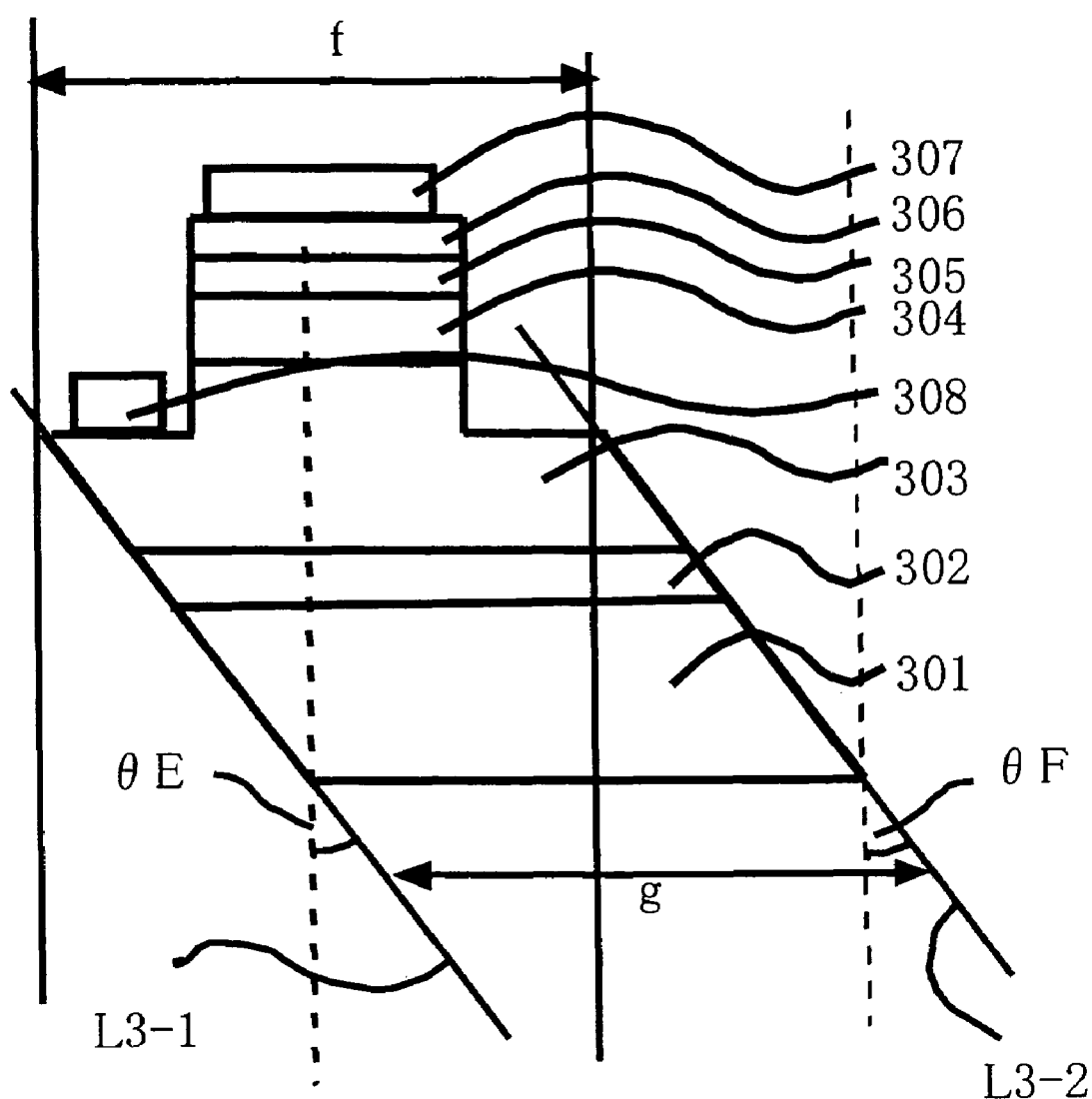
FIG. 4 is a schematic cross section illustrating another manner of dividing an epitaxial wafer into a plurality of GaN-based compound semiconductor light-emitting diode chips according to the third embodiment of the present invention.

In each of FIGS. 3 and 4, a chip division method is illustrated in schematic cross section in connection with a GaN-based compound semiconductor light-emitting diode according to a third embodiment of the present invention. A method of fabricating a plurality of layers 301–308 in each of FIGS. 3 and 4 is similar to that for layers 101–108 of the first embodiment, and thus will not be described repeatedly. In the third embodiment also, a sapphire substrate 301 having a thickness of 430 µm was used similarly as in the first embodiment. Furthermore, in the third embodiment also, laser scribing was utilized to divide an epitaxial wafer into light-emitting diode chips, similarly as in the first embodiment.

In each of FIGS. 3 and 4 in connection with the third embodiment, the incidence angle of laser light entering the substrate was controlled using a jig to control angles θE and θF of laser scribe lines L3-1 and L3-2 relative to broken line(s) perpendicular to the main surface of the substrate, similarly as in the second embodiment. An upper region of the semiconductor layers for radiating light was set to have a side length f of 350 µm, and the backside of the substrate was set to have a side length g of 200 µm by adjusting θE and θF. Scribe lines L3-1 and L3-2 were set to have clockwise angles of θE<0° and θF=0° respectively relative to the broken line perpendicular to the main surface of the substrate in FIG. 3, while they were set have clockwise angles of θE <0° and θF<0° respectively in FIG. 4.

Each of the resulting light-emitting diode chips of FIGS. 3 and 4 generated an optical power output of Po=5.2 mW for the input current of If=20 mA. That is, it recognized that the light-emitting diode chip of the third embodiment as well as the second embodiment can have an improved efficiency of extracting light towards the outside as compared to the first embodiment, for similar reasons as for the second embodiment.

Incidentally, although each of the above embodiments used a sapphire substrate having a C (0001) plane orientation as its main surface, the effects of the present invention can be obtained also by using a sapphire substrate having one of plane orientations such as A (11–20) plane, M (1100) plane and R (1102) plane, or having an off-angle plane orientation deviated from one of those plane orientations. Further, it is also possible to use a GaN substrate, a spinel substrate or an SiC substrate. Moreover, although the incident angle of laser light relative to the sapphire substrate was controlled by the jig for fixing the substrate in each of the above embodiments, it is also possible to control the laser light using a mirror or the like so as to adjust the incident angle relative to the sapphire substrate.

As described above, the present invention can provide a nitride semiconductor light-emitting diode chip with an improved light extraction efficiency and a good yield rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a nitride semiconductor light emitting diode chip including a transparent substrate having a main surface and a nitride semiconductor stacked-layer structure having a light-emitting layer and a plurality of additional semiconductor layers epitaxially grown on said main surface of said substrate, comprising the steps of:

forming an epitaxial wafer including said nitride semiconductor stacked-layer structure by crystal growth on said main surface of said substrate, and dividing said wafer to obtain said chip having at least one inclined side surface by directing laser light at an inclined incidence angle to said main surface of said substrate, whereby realizing an improved yield rate of the chip and providing an improved efficiency of extracting light from said chip.

2. The method according to claim 1, wherein a solid laser device is used as a source of said laser light, and said substrate is selected from a group consisting of a sapphire substrate, a GaN substrate, a spinel substrate, and an SiC substrate.

* * * * *